(12) United States Patent
Qing

(10) Patent No.: US 10,578,902 B2
(45) Date of Patent: Mar. 3, 2020

(54) DISPLAY DEVICE HAVING CIRCULAR DISPLAY PANEL AND METHOD FOR FABRICATING THE SAME

(71) Applicants: BOE Technology Group Co., Ltd., Beijing (CN); Chengdu BOE Optoelectronics Technology Co., Ltd., Chengdu (CN)

(72) Inventor: Wei Qing, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 16/133,221

(22) Filed: Sep. 17, 2018

(65) Prior Publication Data

US 2019/0302511 A1  Oct. 3, 2019

(30) Foreign Application Priority Data

Mar. 30, 2018 (CN) .......................... 2018 1 0310773

(51) Int. Cl.
*G02F 1/1333* (2006.01)
*G02F 1/1345* (2006.01)
*H01L 51/52* (2006.01)
*H01L 51/56* (2006.01)
*H05K 1/18* (2006.01)
*G04G 17/04* (2006.01)

(52) U.S. Cl.
CPC .... *G02F 1/133308* (2013.01); *G02F 1/13452* (2013.01); *H01L 51/5237* (2013.01); *H01L 51/56* (2013.01); *H05K 1/189* (2013.01); *G04G 17/045* (2013.01)

(58) Field of Classification Search
CPC ... G02F 2001/133314; G02F 1/133308; G02F 2001/133322; G02F 1/13452; H05K 1/189; G04G 17/045
See application file for complete search history.

(56) References Cited

U.S. PATENT DOCUMENTS 5,740,482 A * 4/1998 Inazuka .............. G02F 1/13452
                                                 396/281
5,774,199 A * 6/1998 Ozawa .............. G02F 1/133615
                                                 349/149
5,805,251 A * 9/1998 Ozawa .............. G02F 1/133308
                                                 174/36

(Continued)

*Primary Examiner* — Daniel P Wicklund
*Assistant Examiner* — Douglas R Burtner
(74) *Attorney, Agent, or Firm* — Arent Fox LLP; Michael Fainberg

(57) ABSTRACT

A display device and a method for fabricating the same are disclosed. The display device includes a circular display panel comprising a flexible circuit board and a positioning plate; a side of the flexible circuit board at which a component is welded is arranged towards a bottom of a containing chamber of the display device; a region of the flexible circuit board in which no component is welded has a slot opened along a line of a semi-enclosed shape, a positioning area defined by the slot can bend along a connecting line formed between two ends of the slot; the positioning plate which fixed in the positioning area and arranged at a same side with the component is provided with a positioning hole corresponding to a hole-shaped structure arranged in the positioning area and a positioning pin arranged at a bottom of the containing chamber respectively.

19 Claims, 4 Drawing Sheets

(56) References Cited

U.S. PATENT DOCUMENTS

| | | | |
|---|---|---|---|
| 6,342,932 B1* | 1/2002 | Terao | G02F 1/13452 349/150 |
| 6,358,065 B1* | 3/2002 | Terao | G02F 1/133308 349/150 |
| 2002/0125815 A1* | 9/2002 | Wakita | G02F 1/133308 313/491 |
| 2005/0195578 A1* | 9/2005 | Chang | G02F 1/13452 361/749 |
| 2006/0152664 A1* | 7/2006 | Nishio | G02F 1/13452 349/150 |
| 2007/0013824 A1* | 1/2007 | Yu | G02F 1/133308 349/58 |
| 2007/0019127 A1* | 1/2007 | Oohira | G02F 1/13452 349/58 |
| 2007/0019275 A1* | 1/2007 | Okuda | G02F 1/133615 359/265 |
| 2007/0188692 A1* | 8/2007 | Fukusako | H05K 1/0204 349/150 |
| 2007/0263998 A1* | 11/2007 | Lien | H05K 1/189 396/144 |
| 2008/0068785 A1* | 3/2008 | Noguchi | G02F 1/13452 361/679.01 |
| 2008/0106874 A1* | 5/2008 | Okuda | G02F 1/13452 361/749 |
| 2008/0146050 A1* | 6/2008 | Ju | H01R 12/592 439/66 |
| 2008/0284937 A1* | 11/2008 | Jang | G02F 1/133308 349/58 |
| 2011/0157844 A1* | 6/2011 | Chan | G02F 1/133308 361/749 |
| 2011/0164005 A1* | 7/2011 | Miyata | G02F 1/13452 345/204 |
| 2011/0187965 A1* | 8/2011 | Ooishi | G09F 13/04 349/62 |
| 2011/0211139 A1* | 9/2011 | Itoh | G02F 1/13452 349/60 |
| 2012/0193207 A1* | 8/2012 | He | G06F 21/83 200/5 A |
| 2013/0215359 A1* | 8/2013 | Chun | G02F 1/1333 349/58 |
| 2013/0257659 A1* | 10/2013 | Darnell | H01Q 1/243 343/702 |
| 2013/0328051 A1* | 12/2013 | Franklin | H01L 29/786 257/59 |
| 2016/0299375 A1* | 10/2016 | Ma | G02F 1/133308 |
| 2017/0176806 A1* | 6/2017 | Kang | G02B 6/0083 |

\* cited by examiner

DISPLAY DEVICE HAVING CIRCULAR DISPLAY PANEL AND METHOD FOR FABRICATING THE SAME

CROSS-REFERENCE TO RELATED APPLICATION

This Application claims priority to Chinese Patent Application No. 201810310773.8, filed on Mar. 30, 2018, the content of which is incorporated by reference in the entirety.

TECHNICAL FIELD

This disclosure relates to the field of display technologies, and particularly to a display device and a method for fabricating the same.

DESCRIPTION OF THE RELATED ART

An Organic Light-Emitting Diode (OLED) display device has been listed as a next-generation display technology with great development prospect due to its advantages such as thinness, lightness, wide angle of view, self-luminescence, continuously adjustable emitting color, low cost, fast response speed, low energy consumption, low drive voltage, wide range of operating temperature, simple production process, high luminous efficiency, flexible display and the like.

SUMMARY

Embodiments of the disclosure provide a display device and a method for fabricating the same.

In an aspect, the embodiments of the disclosure provide a display device including a housing having a containing chamber, and a circular display panel located in the containing chamber; wherein a bottom of the containing chamber is provided with a positioning pin, and the circular display panel includes a display panel body, a flexible circuit board and a positioning plate, wherein: the flexible circuit board is arranged at a back side of a light-emitting side of the display panel body, and a side of the flexible circuit board at which a component is welded is arranged towards the bottom of the containing chamber; a region of the flexible circuit board in which no component is welded has a slot opened along a line of a semi-enclosed shape, and a positioning area defined by the slot is able to bend along a connecting line formed between two ends of the slot; wherein the positioning area is provided with a hole-shaped structure; the positioning plate is fixed in the positioning area and arranged at a same side with the component on the flexible circuit board, and the positioning plate is provided with a positioning hole corresponding to the hole-shaped structure and the positioning pin respectively.

In some embodiments, the line of the semi-enclosed shape is arc-shaped, U-shaped or V-shaped.

In some embodiments, the numbers of the positioning pin, the hole-shaped structure and the positioning hole are at least two respectively, and each positioning hole matches with a corresponding positioning pin and a corresponding hole-shaped structure to form a set of positioning structures.

In some embodiments, the numbers of the positioning pin, the hole-shaped structure and the positioning hole are four respectively; and respective positioning holes match respectively with corresponding positioning pins and corresponding hole-shaped structures to form four sets of positioning structures.

In some embodiments, the bottom of the containing chamber is provided with a groove matching with a shape of the positioning plate, and the positioning pin is arranged in the groove.

In some embodiments, a region of the bottom of the containing chamber corresponding to the component on the flexible circuit board is provided with a groove suitable for a height of the component.

In some embodiments, a length of the positioning pin is not greater than a thickness of the positioning plate.

In some embodiments, a shape of the positioning plate is rectangle, circle or polygon.

In some embodiments, the positioning plate is fixed in the positioning area of the flexible circuit board via glue.

In some embodiments, the positioning plate is fixed in the positioning area of the flexible circuit board via thermosensitive glue.

In some embodiments, the circular display panel is an organic light-emitting diode display panel.

In some embodiments, the circular display panel is a liquid crystal display panel.

In some embodiments, the circular display panel includes a display panel of which an outline is circular but an edge line is in a straight line shape.

In some embodiments, the display device is a watch.

In some embodiments, the display device is a circular wearable mobile phone.

In another aspect, the embodiments of the disclosure further provide a method for fabricating the display device according to the embodiments of the disclosure, the method includes an operation of assembling the flexible circuit board and the positioning plate, wherein the operation of assembling the flexible circuit board and the positioning plate includes: providing the slot arranged along the line of the semi-enclosed shape in the region of the flexible circuit board in which no component is to be welded, wherein the positioning area defined by the slot is able to bend along the connecting line formed between two ends of the slot, and the positioning area is provided with the hole-shaped structure; fixing the positioning plate provided with the positioning hole to the side of the flexible circuit board at which the component is to be welded, so that the positioning plate is located in the positioning area and positions of the positioning hole and the hole-shaped structure are opposite to each other; bending the positioning area towards a direction away from the side of the flexible circuit board at which the component is to be welded; printing a solder paste on a whole side of the flexible circuit board at which the component is to be welded, and welding the component to the flexible circuit board; resetting the positioning area.

In some embodiments, after the operation of assembling the flexible circuit board and the positioning plate is finished, the method further includes: adhering the flexible circuit board with a fixed positioning plate to the back side of the light-emitting side of the display panel body to form the circular display panel; assembling the circular display panel into the containing chamber of the housing of the display device, so that the side of the flexible circuit board at which the component is welded is arranged towards the bottom of the containing chamber, and positions of the positioning hole on the positioning plate and the positioning pin arranged at the bottom of the containing chamber are opposite to each other.

In some embodiments, the numbers of the positioning pin, the hole-shaped structure and the positioning hole are at least two respectively, and each positioning hole matches with a corresponding positioning pin and a corresponding hole-shaped structure to form a set of positioning structures.

In some embodiments, the bottom of the containing chamber is provided with a groove matching with a shape of the positioning plate, and the positioning pin is arranged in the groove.

In some embodiments, a length of the positioning pin is not greater than a thickness of the positioning plate.

BRIEF DESCRIPTION OF THE DRAWINGS

In order to make the technical solutions according to embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

With the development of the OLED technology, a display device tends to have a narrow border or even no border gradually, and the shape of the display device is no longer limited to a regular shape such as a rectangle either, and accordingly an abnormally shaped display panel appears gradually in people's perspectives, for example, a circular display panel applicable to a device such as a watch or a wearable mobile phone. By taking the watch as an example, it includes a housing having a containing chamber, and a circular display panel located in the containing chamber. Since the circular display panel rotates more easily, the assembly precision of the display device will be relatively low if the circular display panel is not positioned but assembled into the containing chamber directly; further, since a base substrate of the circular display panel is thinner and has a lower strength, it is not suitable to arrange a positioning structure on the base substrate directly.

Based upon this, how to position the circular display panel and increase the assembly precision of the display device is a technical problem which urgently needs to be solved in the related art.

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

It shall be appreciated that the following descriptions of the embodiments presented herein are merely intended to illustrate and describe, but not to limit the disclosure.

Figure 1:
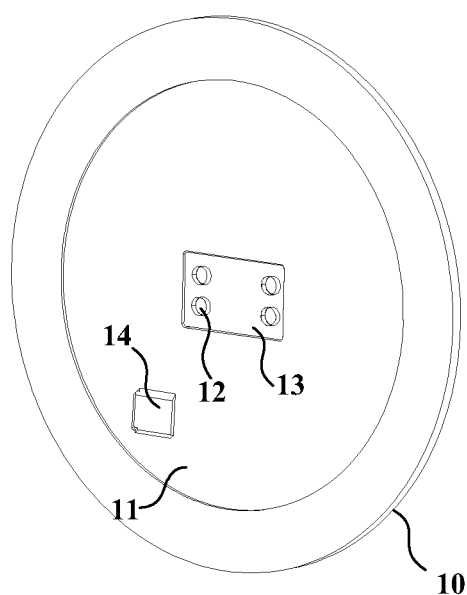
FIG. 1 is a schematic structural diagram of a housing of the embodiments of the disclosure.
Figure 2:
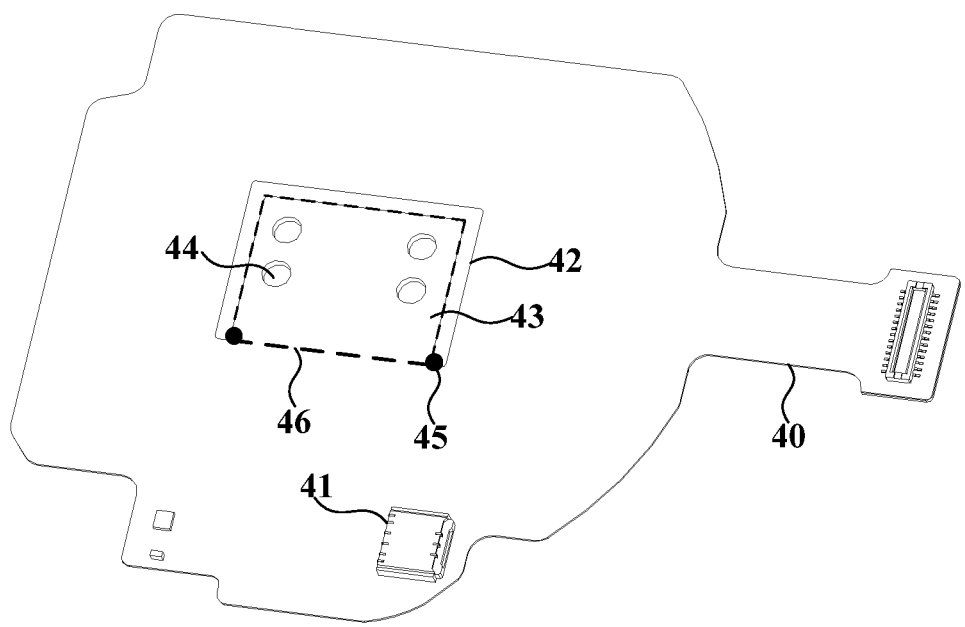
FIG. 2 is a schematic structural diagram of a flexible display panel of the embodiments of the disclosure.
Figure 4:
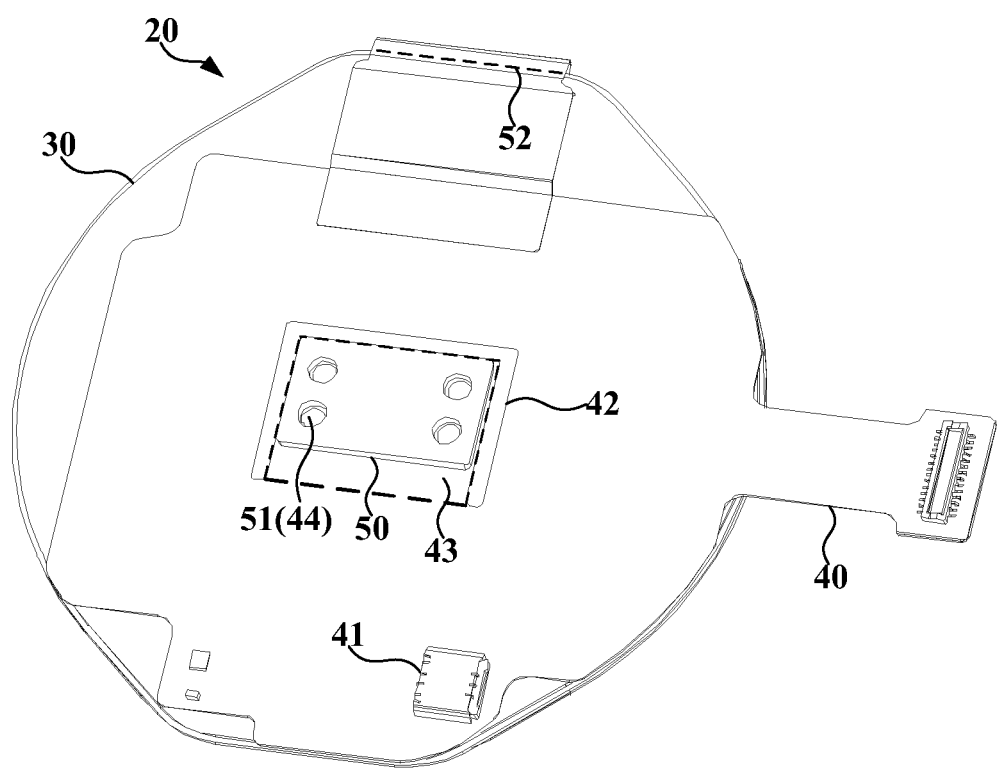
FIG. 4 is a schematic structural diagram of a circular display panel of the embodiments of the disclosure.
Figure 5:
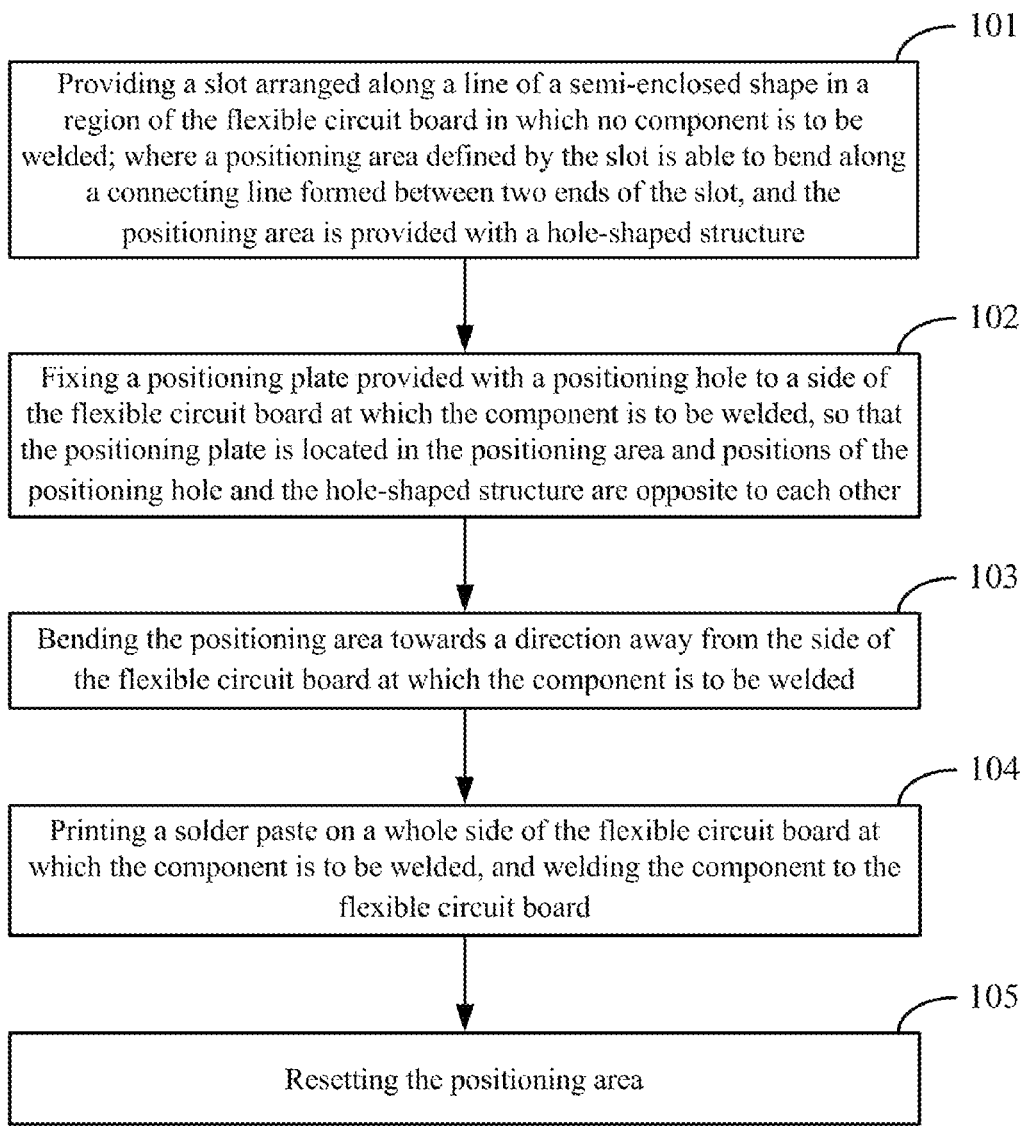
FIG. 5 is a flow chart of a method for assembling a flexible circuit board and a positioning plate of the embodiments of the disclosure.

As illustrated in FIG. 1, FIG. 2 and FIG. 4, the embodiments of the disclosure provide a display device including a housing 10 having a containing chamber 11, and a circular display panel 20 located in the containing chamber 11; where a bottom of the containing chamber 11 is provided with a positioning pin 12, and the circular display panel 20 includes a display panel body 30, a flexible circuit board 40 and a positioning plate 50.

Where the flexible circuit board 40 is arranged at a back side of a light-emitting side of the display panel body 30, and a side of the flexible circuit board 40 at which a component 41 is welded is arranged towards the bottom of the containing chamber 11; a region of the flexible circuit board 40 in which no component 41 is welded has a slot 42 opened along a line of a semi-enclosed shape, a positioning area 43 defined by the slot 42 is able to bend along a connecting line 46 formed between two ends 45 of the slot 42; where the positioning area 43 is provided with a hole-shaped structure 44, the positioning plate 50 is fixed in the positioning area 43 and arranged at the same side with the component 41 on the flexible circuit board 40, and the positioning plate 50 is provided with a positioning hole 51 corresponding to the hole-shaped structure 44 and the positioning pin 12 respectively.

In the embodiments of the disclosure, the circular display panel 20 includes but not limited to an OLED display panel, a liquid crystal display panel or the like. The display device includes but not limited to a watch, a circular wearable mobile phone or the like. That is, both the type of the circular display panel and the type of the display device are not limited in the embodiments of the disclosure. Further, it shall be noted that, in the embodiments of the disclosure, the circular display panel does not mean that the shape of the display panel must strictly be circular, and can also be a display panel of which an outline is circular but an edge line is in a straight line shape 52, for example in an embodiment as illustrated in FIG. 4.

In order to position the circular display panel, a feasible approach is to arrange a positioning plate on the flexible circuit board. As can be known by those skilled in the art, there is a need to weld a capacitance, a transistor or other components on one side of the flexible circuit board. During the welding, there is a need to print a solder paste on the whole welding side of the flexible circuit board by using a solder paste printing machine. If the positioning plate is fixed to the welding side of the flexible circuit board before the welding, the surface of the welding side of the flexible circuit board may not be smooth, and a whole surface printing of the solder paste cannot be finished accordingly. However, if the component(s) is (or are) welded firstly and the positioning plate is fixed secondly to the welding side of the flexible circuit board, since the positioning plate needs to be fit onto the flexible circuit board using the thermo-sensitive glue at a high temperature, the high temperature may also have a negative impact on the component(s) welded on the flexible circuit board. Thus, if it is desired to fix the positioning plate to the flexible circuit board in the case of not affecting the normal welding of the component(s), the positioning plate and the component(s) can only be arranged on two sides of the flexible circuit board respectively, which definitely increases the thickness of the flexible circuit board, so that the overall thickness of the display device is relatively thick, and the light and thin design cannot be easily obtained.

With the technical solutions of the embodiments of the disclosure, when the display device is assembled, the positioning plate 50 needs to be fixed to the flexible circuit board 40 firstly, and for example, the positioning plate 50 with a positioning hole 51 is fixed to a side of the flexible circuit board 40 at which the component 41 is to be welded so that the positioning plate 50 is located in the positioning area 43 and positions of the positioning hole 51 and the hole-shaped structure 44 are opposite to each other, thus the positioning plate 50 and the flexible circuit board 40 can be positioned accurately. And then the positioning area 43 with the fixed positioning plate 50 is bended towards a direction away from the side of the flexible circuit board 40 at which the component 41 is to be welded, thus a region other than the positioning area 43 at the side of the flexible circuit board 40 at which the component 41 is to be welded is in the same plane after bending, and the positioning plate is located at a side of this plane facing away from the component to be welded. At this time, the solder paste can be printed in this area without being affected by the positioning plate, then the component 41 is welded on the flexible circuit board 40, and finally the positioning area 43 is reset.

As can be seen, this solution can arrange the component 41 and the positioning plate 50 at the same side of the flexible circuit board 40 in the case of not affecting the normal welding of the component 41. Thus, the flexible circuit board 40 with the fixed positioning plate 50 is adhered to the back side of the light-emitting side of the display panel body 30 to form the circular display panel 20. When the circular display panel 20 is assembled into the containing chamber 11 of the housing 10, there is only a need to match the positioning hole 51 of the positioning plate 50 with the positioning pin 12 to realize the positioning of the circular display panel 20 and the housing 10. Therefore, the embodiments of the disclosure can realize the positioning of the circular display panel 20 and increase the assembly precision of the display device without increasing the overall thickness of the display device, as compared with the related art.

Here, the shape of the line of the semi-enclosed shape is not limited, so long as the line and the connecting line between two ends of the line can form a closed region and the region can bend along the connecting line 46. For example, in some embodiments, the line of the semi-enclosed shape can be arc-shaped, V-shaped, or U-shaped as illustrated in FIG. 2.

Figure 3:
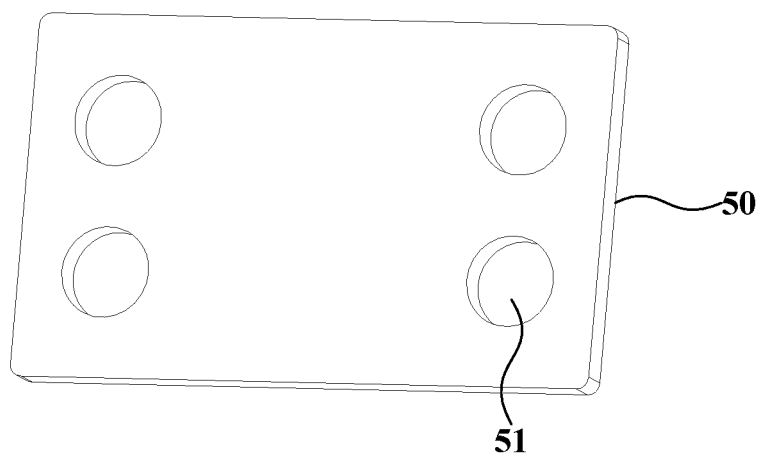
FIG. 3 is a schematic structural diagram of a positioning plate of the embodiments of the disclosure.

In some embodiments, the shape of the positioning plate 50 is not limited either, and for example can be a rectangle illustrated in FIG. 3, or a circle, a polygon or the like, so long as it does not exceed the range of the positioning area 43 defined by the slot 42.

In some embodiments, the positioning plate 50 is adhered to the positioning area 43 of the flexible circuit board 40 by the glue, such as the thermo-sensitive glue or the like.

In some embodiments, the numbers of the positioning pin 12, the hole-shaped structure 44 and the positioning hole 51 are at least two respectively, and each positioning hole 51 matches with a corresponding positioning pin 12 and a corresponding hole-shaped structure 44 to form a set of positioning structures. As illustrated in FIG. 4, the numbers of the positioning pin 12, the hole-shaped structure 44 and the positioning hole 51 are four respectively, and at this time, there are four sets of positioning structures between the circular display panel 20 and housing, so the assembly precision of the display device can be further increased.

As illustrated in FIG. 1 and FIG. 4, the bottom of the containing chamber 11 is provided with a groove 13 matching with the shape of the positioning plate 50, and the positioning pin 12 is arranged in the groove 13. With this technical solution, when the circular display panel 20 is assembled in the containing chamber 11 of the housing 10, the positioning plate 50 can be embedded into the groove 13 on the bottom of the containing chamber 11, thus making the structure of the display device more compact and stable. It shall be noted that, a region of the bottom of the containing chamber 11 corresponding to the component 41 on the flexible circuit board 40 is also provided with a groove 14 as shown in FIG. 1 suitable for a height of the component 41, so that the flexible circuit board 40 fits onto the bottom of the containing chamber 11 much better.

In some embodiments of the disclosure, a length of the positioning pin 12 is not greater than a thickness of the positioning plate 50. With this solution, not only the circular display panel 20 can be positioned in the housing 10, but also an end of the positioning pin 12 can be avoided from touching against the display panel body 30 to reduce the risk of damaging the display panel body.

Based upon a same inventive concept, as illustrated in FIG. 2 to FIG. 5, the embodiments of the disclosure further provide a method for fabricating the display device above according to any one of the embodiments of the disclosure, where the method includes an operation of assembling the flexible circuit board 40 and the positioning plate 50, which includes following operations.

Operation 101: providing a slot 42 arranged along a line of a semi-enclosed shape in a region of the flexible circuit board 40 in which no component 41 is to be welded; where a positioning area 43 defined by the slot 42 is able to bend along a connecting line formed between two ends of the slot 42, and the positioning area 43 is provided with a hole-shaped structure 44.

Operation 102: fixing a positioning plate 50 provided with a positioning hole 51 to a side of the flexible circuit board 40 at which the component 41 is to be welded, so that the positioning plate 50 is located in the positioning area 43 and positions of the positioning hole 51 and the hole-shaped structure 44 are opposite to each other.

Operation 103: bending the positioning area 43 towards a direction away from the side of the flexible circuit board 40 at which the component 41 is to be welded.

Operation 104: printing a solder paste on a whole side of the flexible circuit board 40 at which the component 41 is to be welded, and welding the component 41 to the flexible circuit board 40.

Operation 105: resetting the positioning area 43.

In some embodiments, after finishing the operation of assembling the flexible circuit board 40 and the positioning plate 50, the method further includes following operations.

Adhering the flexible circuit board 40 with the fixed positioning plate 50 to a back side of a light-emitting side of a display panel body 30 to form a circular display panel 20.

Assembling the circular display panel 20 into a containing chamber 11 of a housing 10 of the display device, so that a side of the flexible circuit board 40 at which the component 41 is welded is arranged towards a bottom of the containing chamber 11, and positions of the positioning hole 51 on the positioning plate 50 and a positioning pin 12 arranged at the bottom of the containing chamber 11 are opposite to each other.

It shall be noted that, since the method for fabricating the display device address the problem using a similar principle with the display device above, reference can be made to the embodiments of the display device above for an implementation of the method for fabricating the display device, so a repeated description thereof will be omitted here.

With the technical solutions of the embodiments of the disclosure, the component 41 and the positioning plate 50 can be arranged at the same side of the flexible circuit board 40 in the case of not affecting the normal welding of the component 41. Thus, the flexible circuit board 40 with the fixed positioning plate 50 is adhered to the back side of the light-emitting side of the display panel body 30 to form the circular display panel 20. When the circular display panel 20 is assembled into the containing chamber of the housing, there is only a need to match the positioning hole 51 of the positioning plate 50 with the positioning pin to realize the positioning of the circular display panel 20 and the housing 10. Therefore, the embodiments of the disclosure can realize the positioning of the circular display panel 20 and increase the assembly precision of the display device without increasing the overall thickness of the display device, as compared with the related art.

Evidently those skilled in the art can make various modifications and variations to the disclosure without departing from the spirit and scope of the disclosure. Thus the disclosure is also intended to encompass these modifications and variations therein as long as these modifications and variations come into the scope of the claims of the disclosure and their equivalents.

What is claimed is:

1. A display device, comprising a housing having a containing chamber, and a circular display panel located in the containing chamber; wherein a bottom of the containing chamber is provided with a positioning pin, and the circular display panel comprises a display panel body, a flexible circuit board and a positioning plate, wherein:
   the flexible circuit board is arranged at a back side of a light-emitting side of the display panel body, and a side of the flexible circuit board at which a component is welded is arranged towards the bottom of the containing chamber;
   a region of the flexible circuit board in which no component is welded has a slot opened along a line of a semi-enclosed shape, and a positioning area defined by the slot is able to bend along a connecting line formed between two ends of the slot;
   the positioning area is provided with a hole-shaped structure; the positioning plate is fixed in the positioning area and arranged at a same side with the component on the flexible circuit board, and the positioning plate is provided with a positioning hole corresponding to the hole-shaped structure and the positioning pin respectively.

2. The display device according to claim 1, wherein numbers of the positioning pin, the hole-shaped structure and the positioning hole are at least two respectively, and each positioning hole matches with a corresponding positioning pin and a corresponding hole-shaped structure to form a set of positioning structures.

3. The display device according to claim 2, wherein the numbers of the positioning pin, the hole-shaped structure and the positioning hole are four respectively; and respective positioning holes match respectively with corresponding positioning pins and corresponding hole-shaped structures to form four sets of positioning structures.

4. The display device according to claim 1, wherein the bottom of the containing chamber is provided with a groove matching with a shape of the positioning plate, and the positioning pin is arranged in the groove.

5. The display device according to claim 1, wherein a region of the bottom of the containing chamber corresponding to the component on the flexible circuit board is provided with a groove suitable for a height of the component.

6. The display device according to claim 1, wherein a length of the positioning pin is not greater than a thickness of the positioning plate.

7. The display device according to claim 1, wherein a shape of the positioning plate is rectangle.

8. The display device according to claim 1, wherein the positioning plate is fixed in the positioning area of the flexible circuit board via glue.

9. The display device according to claim 8, wherein the positioning plate is fixed in the positioning area of the flexible circuit board via thermo-sensitive glue.

10. The display device according to claim 1, wherein the circular display panel is an organic light-emitting diode display panel.

11. The display device according to claim 1, wherein the circular display panel is a liquid crystal display panel.

12. The display device according to claim 1, wherein the circular display panel comprises a display panel of which an outline is circular but an edge line is in a straight line shape.

13. The display device according to claim 1, wherein the display device is a watch.

14. The display device according to claim 1, wherein the display device is a circular wearable mobile phone.

15. A method for fabricating the display device according to claim 1, comprising an operation of assembling the flexible circuit board and the positioning plate, wherein the operation of assembling the flexible circuit board and the positioning plate comprises:
   providing the slot arranged along the line of the semi-enclosed shape in the region of the flexible circuit board in which no component is to be welded; wherein the positioning area defined by the slot is able to bend along the connecting line formed between two ends of the slot, and the positioning area is provided with the hole-shaped structure;
   fixing the positioning plate provided with the positioning hole to the side of the flexible circuit board at which the component is to be welded, so that the positioning plate is located in the positioning area and positions of the positioning hole and the hole-shaped structure are opposite to each other;
   bending the positioning area towards a direction away from the side of the flexible circuit board at which the component is to be welded;
   printing a solder paste on a whole side of the flexible circuit board at which the component is to be welded, and welding the component to the flexible circuit board;
   resetting the positioning area.

16. The method according to claim 15, wherein after the operation of assembling the flexible circuit board and the positioning plate is finished, the method further comprises:
   adhering the flexible circuit board with a fixed positioning plate to the back side of the light-emitting side of the display panel body to form the circular display panel;
   assembling the circular display panel into the containing chamber of the housing of the display device, so that the side of the flexible circuit board at which the component is welded is arranged towards the bottom of the containing chamber, and positions of the positioning hole on the positioning plate and the positioning pin arranged at the bottom of the containing chamber are opposite to each other.

17. The method according to claim 16, wherein numbers of the positioning pin, the hole-shaped structure and the positioning hole are at least two respectively, and each positioning hole matches with a corresponding positioning pin and a corresponding hole-shaped structure to form a set of positioning structures.

18. The method according to claim 16, wherein the bottom of the containing chamber is provided with a groove matching with a shape of the positioning plate, and the positioning pin is arranged in the groove.

19. The method according to claim 16, wherein a length of the positioning pin is not greater than a thickness of the positioning plate.

* * * * *